(12) United States Patent
Lo et al.

(10) Patent No.: US 8,928,093 B2
(45) Date of Patent: Jan. 6, 2015

(54) FINFET BODY CONTACT AND METHOD OF MAKING SAME

(71) Applicant: Taiwan Semiconductor Manufacturing Company, Ltd., Hsin-Chu (TW)

(72) Inventors: Ching-Hsiung Lo, Jhubei (TW); Jam-Wem Lee, Jhubei (TW); Wun-Jie Lin, Hsin-Chu (TW); Jen-Chou Tseng, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/203,407

(22) Filed: Mar. 10, 2014

(65) Prior Publication Data
US 2014/0193959 A1    Jul. 10, 2014

Related U.S. Application Data

(62) Division of application No. 13/363,026, filed on Jan. 31, 2012, now Pat. No. 8,735,993.

(51) Int. Cl.
| H01L 27/088 | (2006.01) |
| H01L 29/66 | (2006.01) |
| H01L 29/423 | (2006.01) |
| H01L 29/78 | (2006.01) |
| H01L 27/02 | (2006.01) |

(52) U.S. Cl.
CPC ........ *H01L 29/66795* (2013.01); *H01L 29/423* (2013.01); *H01L 29/78* (2013.01); *H01L 27/0255* (2013.01)
USPC ........... 257/401; 257/345; 257/347; 438/151; 438/156

(58) Field of Classification Search
USPC .................... 257/335–347; 438/197; 365/149
See application file for complete search history.

(56) References Cited

U.S. PATENT DOCUMENTS

| 2006/0084211 A1* | 4/2006 | Yang et al. ..................... 438/197 |
| 2008/0084731 A1* | 4/2008 | Lee et al. ...................... 365/149 |
| 2011/0074498 A1* | 3/2011 | Thompson et al. ........... 327/543 |
| 2012/0007180 A1* | 1/2012 | Yin et al. ....................... 257/347 |
| 2012/0012932 A1* | 1/2012 | Perng et al. ................... 257/347 |
| 2012/0112932 A1 | 5/2012 | May |

FOREIGN PATENT DOCUMENTS

KR    100814391 B1    3/2008

\* cited by examiner

*Primary Examiner* — Matthew W Such
*Assistant Examiner* — Frederick B Hargrove
(74) *Attorney, Agent, or Firm* — Slater & Matsil, L.L.P.

(57) ABSTRACT

A semiconductor device may include body contacts on a finFET device for ESD protection. The semiconductor device comprises a semiconductor fin, a source/drain region and a body contact. The source/drain region and the body contact are in the semiconductor fin. A portion of the fin is laterally between the source/drain region and the body contact. The semiconductor fin is on a substrate.

20 Claims, 12 Drawing Sheets

X-Z plane view

Y-Z plane view

X-Z plane view

Y-Z plane view

FINFET BODY CONTACT AND METHOD OF MAKING SAME

This application is a divisional of U.S. application Ser. No. 13/363,026, entitled "FinFET Body Contact and Method of Making Same," filed on Jan. 31, 2012, which application is incorporated herein by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (finFET) were thus developed.

The introduction of finFETs has the advantageous feature of increasing drive current without the cost of occupying more chip area. However, finFET transistors raise numerous issues relating to electrostatic discharge (ESD) performance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
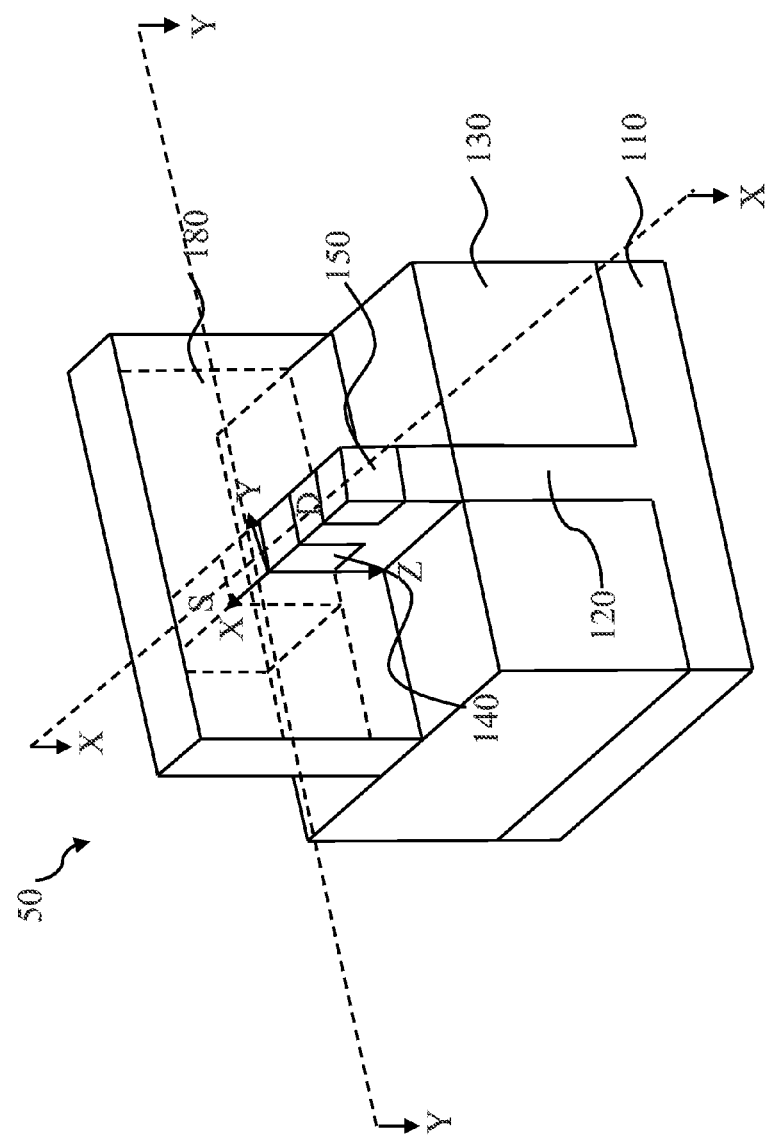
FIGS. 1A and 1B illustrate in perspective view and cross-sectional view, respectively, a finFET in accordance with an embodiment.

Various steps in the formation of a fin device will be described with reference to FIGS. 2A through 8. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1A illustrates a perspective view of a finFET device 50, which includes a substrate 110, a fin 120 above the substrate 110, an isolation region 130 surrounding the fin 120, a gate 180 over the fin 120, source/drain regions 140, and body contacts 150. In an embodiment, substrate 110 may be bulk substrate, such as a bulk silicon wafer commonly employed in CMOS manufacturing processes. Alternatively, substrate 110 may be a compound substrate, such as a silicon-on-insulator (SOI) substrate, or another bulk or compound semiconductor substrate formed of other materials such as germanium, gallium-arsenide, III-V materials, and the like. Only a portion of substrate 110 is illustrated in the figures, as this is sufficient to fully describe the illustrative embodiments.

The fin 120 is formed as a vertical silicon fin extending above the substrate 110, and is used to form the source/drain regions 140, a channel region (not shown) between the source and drain regions, and the body contacts 150. A gate dielectric layer (not shown) may be formed in the channel region. The gate 180 is then formed around the fin 120 and wraps the fin 120 in the channel region. FinFET device 50 may also include four dummy gates 182 (not shown in FIG. 1A for clarity) over the fin 120 with two dummy gates 182 on each side of the gate 180.

The isolation region 130 may be shallow trench isolation (STI) regions, and may be formed by etching the substrate 110 to form a trench and filling the trench with a dielectric material. In accordance with an embodiment, the isolation regions may be filled with a dielectric material such as an oxide material, a high-density plasma (HDP) oxide or the like.

Figure 1B:
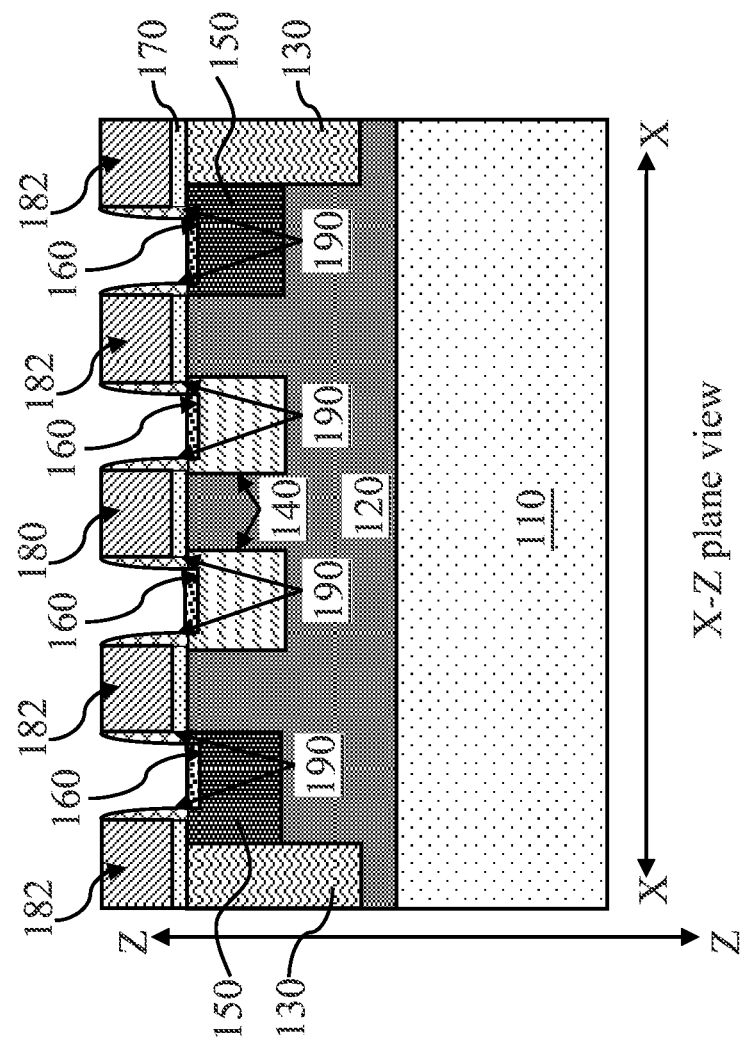

FIG. 1B is a cross-sectional view of an embodiment of the finFET device 50 from the Z plane along the X-X line of FIG. 1. FIG. 1B illustrates an embodiment of the finFET device 50 that includes a gate 180 and four dummy gates 182 over the fin 120 with each gate including a dielectric layer 170 between the gate and the fin 120 and gate spacers 190 on the sides of the gate. In an illustrative embodiment, the fin material is silicon doped with appropriate dopant impurities. There are two dummy gates 182 on each side of the gate 180. The two dummy gates 182 closest to the gate 180 may be used for self-aligned dopant implantation of the source/drain regions 140 and the body contacts 150. The source/drain regions 140 are doped to make these portions of fin 120 conductive. The body contacts 150 are also doped to make these portions of the fin 120 conductive, but they may be doped with a conductivity type opposite of source/drain regions 140. For example, if the source/drain regions 140 are doped with an n-type dopant, the body contacts 150 may be doped with a p-type dopant. In another embodiment, the source/drain regions 140 and the body contact 150 could be formed by first forming recesses and then epitaxially growing the source/drain regions 140 and body contacts 150 by selective epitaxial growth (SEG). In an embodiment, non-selective epitaxial growth could be employed. The source/drain regions 140 and body contacts 150 may be doped either through an implantation method as discussed below, or else by in-situ doping as the material is grown. The source/drain regions 140 and the body contacts 150 may include an electrode layer 160. The electrode layer 160 may comprise a conductive material and may be selected from a group comprising of polycrystalline-silicon (poly-Si), poly-crystalline silicon-germanium (poly-SiGe), metallic nitrides, metallic silicides, metallic oxides, and metals.

The outer dummy gates 182 may be located partially on the isolation region 130 and partially on the body contacts 150. In another embodiment, the outer dummy gates 182 may be located entirely on the isolation region 130. In yet another embodiment, the outer dummy gates 182 may be located entirely on the body contacts 150. The four dummy gates 182 may be used to provide a more even density for a planarizing process of the gates, such as chemical mechanical polishing (CMP).

FIGS. 2A through 8 illustrate a process to form a finFET device according to an embodiment. The figures are cross-sectional views from the Z plane along either the Y-Y line or the X-X line of FIG. 1. Each figure displays the axis that the cross-sectional view is from. Although this embodiment is discussed with steps performed in a particular order, steps may be performed in any logical order.

Figure 2B:
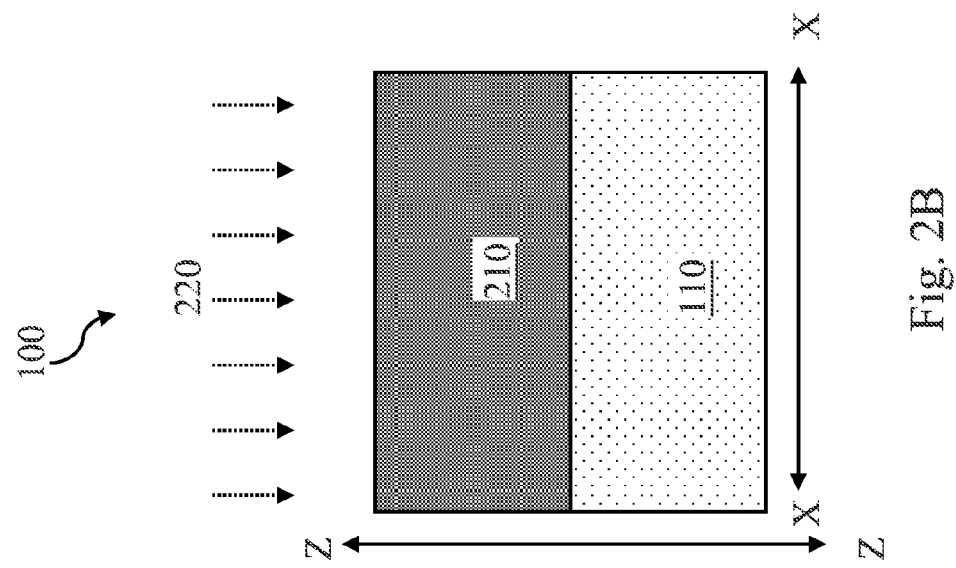
FIGS. 2A through 8 illustrate steps in the manufacture of the structure illustrated in FIGS. 1A and 1B.
Figure 2A:
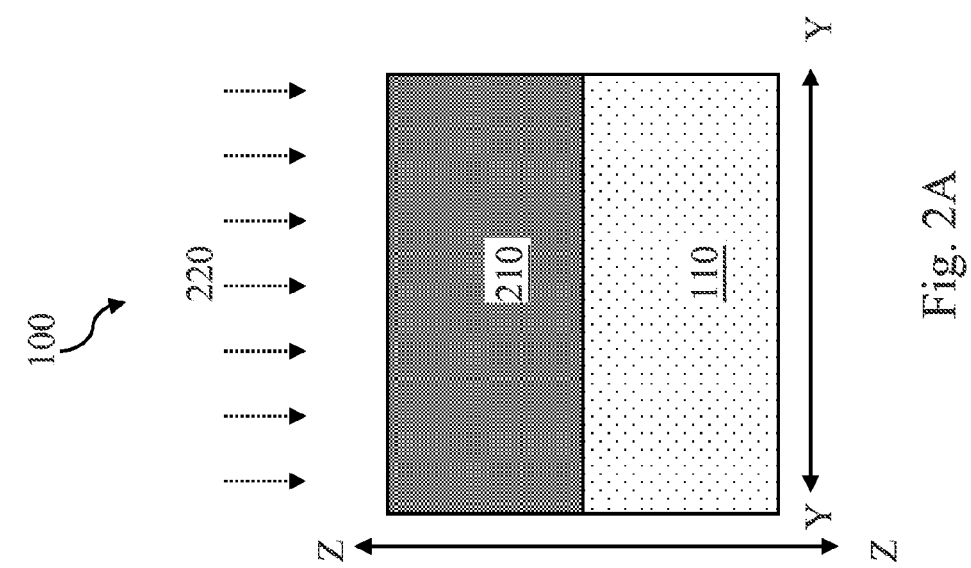

FIGS. 2A and 2B illustrate the finFET device at some point during processing. The device includes a semiconductor layer 210 on a substrate 110. As discussed above, semiconductor layer 210 may comprise bulk silicon or an active layer of a silicon-on-insulator (SOI) substrate. The semiconductor layer 210 may be doped through an implantation process 220 to introduce p-type or n-type impurities into the semiconductor layer 210.

Figure 3B:
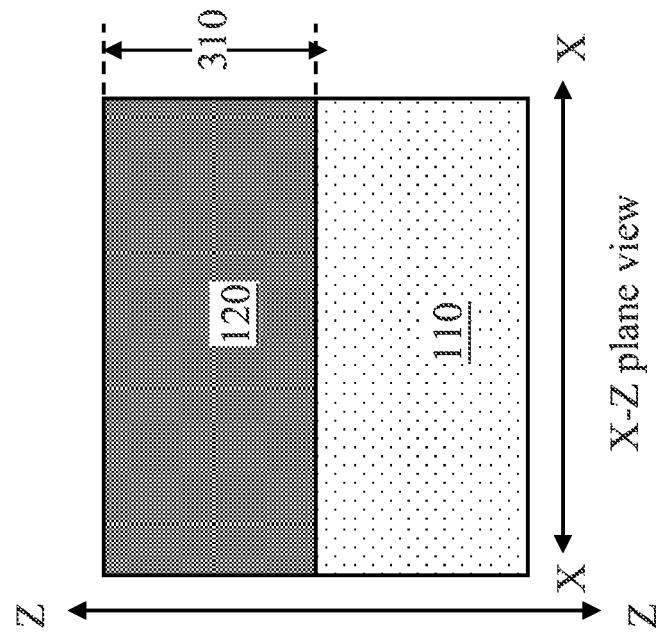
Figure 3A:
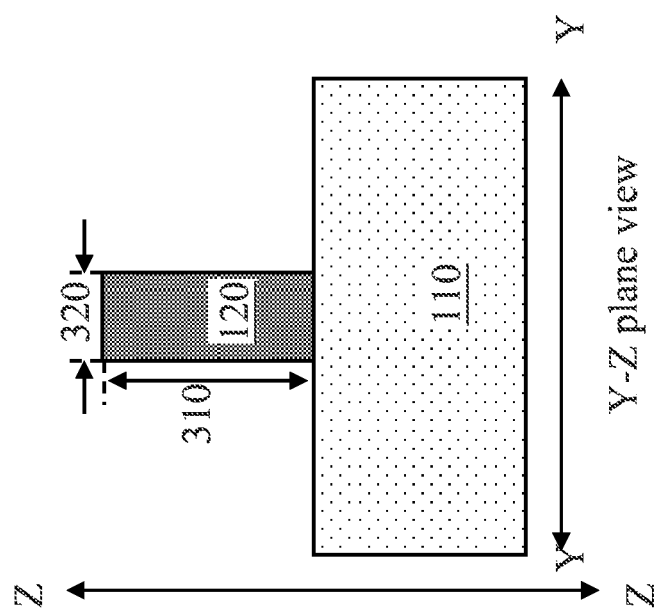

In FIGS. 3A and 3B, the fin 120 is formed by patterning the semiconductor layer 210. The fin patterning process may be accomplished by depositing a commonly used mask material (not shown) such as photoresist or silicon oxide over the semiconductor layer 210. The mask material is then patterned and the semiconductor layer 210 is etched in accordance with the pattern. In this manner, a semiconductor structure of a semiconductor fin overlying a substrate may be formed. As illustrated in FIGS. 3B, the fin 120 extends along the line X-X of FIG. 1. In an alternative embodiment, fin 120 may be epitaxially grown from a top surface of substrate 110 within trenches or openings formed in a patterned layer atop substrate 110. Because the process is known in the art, the details are not repeated herein. In an embodiment, as shown in FIGS. 3A and 3B, the fin 120 may have a width 320 of between approximately 2 nm and 20 nm and a height 310 of between 7 nm and 50 nm.

Figure 4B:
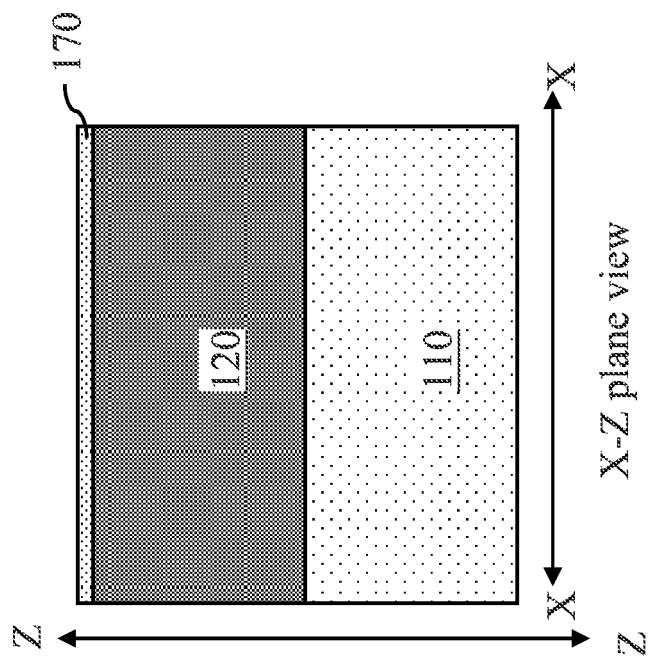
Figure 4A:
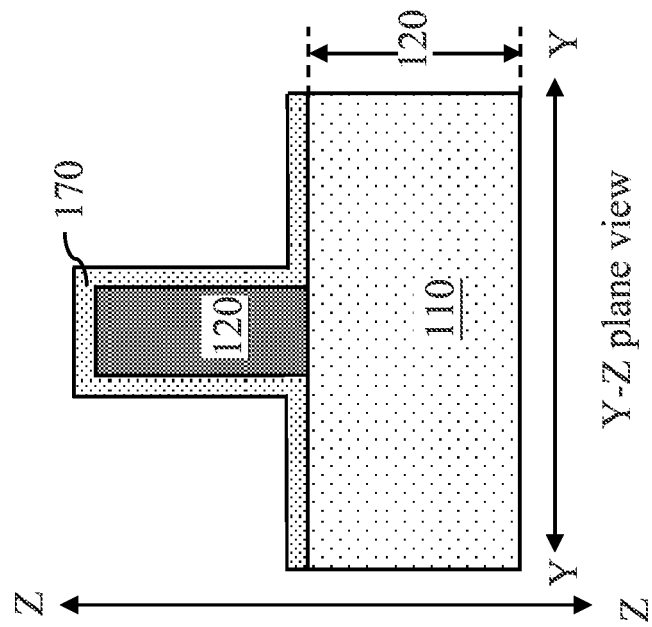

FIGS. 4A and 4B illustrate the formation of the gate dielectric layer 170. The gate dielectric layer 170 may be formed by thermal oxidation, CVD, sputtering, or any other methods known and used in the art for forming a gate dielectric. In other embodiments, the gate dielectric layer 170 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, and the like, and combinations and multi-layers thereof. In another embodiment, the gate dielectric layer 170 may have a capping layer selected from metal nitride materials such as titanium nitride, tantalum nitride, or molybdenum nitride with a thickness from 1 nm to 20 nm.

Figure 5B:
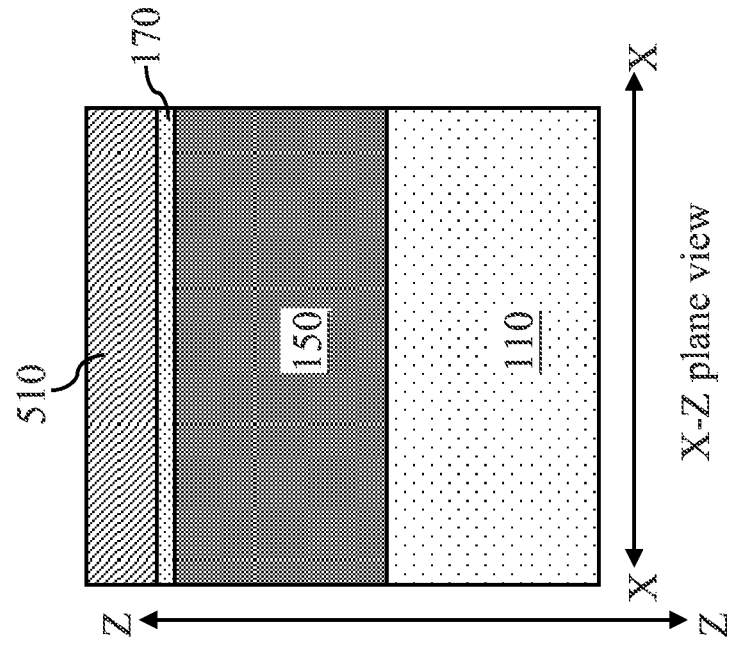
Figure 5A:
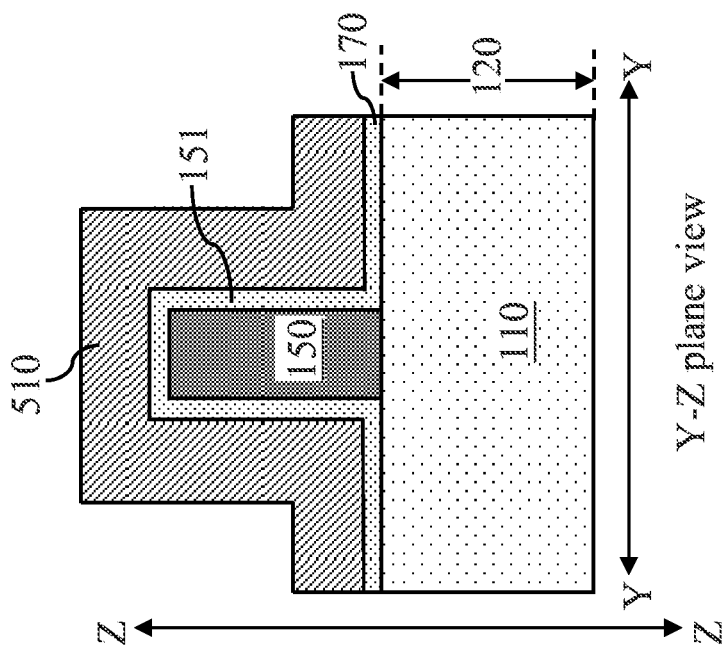

In FIGS. 5A and 5B, the gate electrode layer 510 may be formed over the gate dielectric layer 170. The gate electrode layer 510 may comprise a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode layer 510 may be deposited by CVD, sputter deposition, or other techniques known and used in the art for depositing conductive materials. The thickness of the gate electrode layer 510 may be in the range of about 200 angstroms to about 4,000 angstroms. The top surface of the gate electrode layer 510 usually has a non-planar top surface, and may be planarized prior to patterning of the gate electrode layer 510 or gate etch. Ions may or may not be introduced into the gate electrode layer 510 at this point. Ions may be introduced, for example, by ion implantation techniques.

Figure 6:
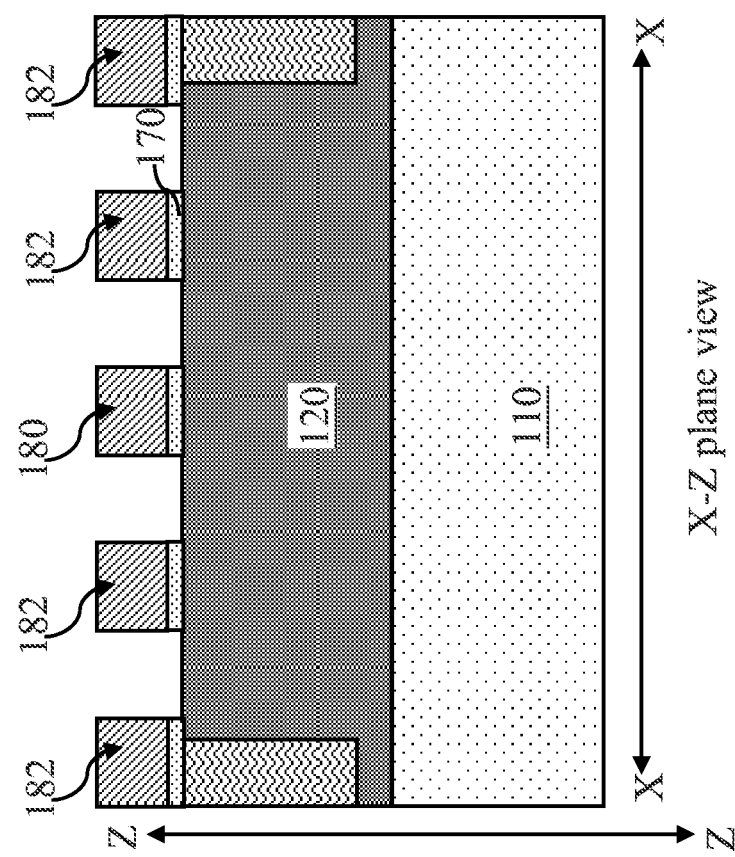

FIG. 6 illustrates the patterning of the gate electrode layer 510 and the gate dielectric layer 170 to form the gate 180 and dummy gates 182. The gates may be formed by depositing and patterning a gate mask (not shown) on the gate electrode layer 510 using, for example, deposition and photolithography techniques known in the art. The gate mask may incorporate commonly used masking materials, such as (but not limited to) photoresist material, silicon oxide, silicon oxynitride, and/or silicon nitride. The gate electrode layer 510 and the gate dielectric layer 170 may be etched using plasma etching to form the patterned gates as illustrated in FIG. 6. In another embodiment, the outside dummy gates 182 are not formed, but just the dummy gates 182 that are between the source/drain regions 140 and the body contacts 150.

Figure 7:
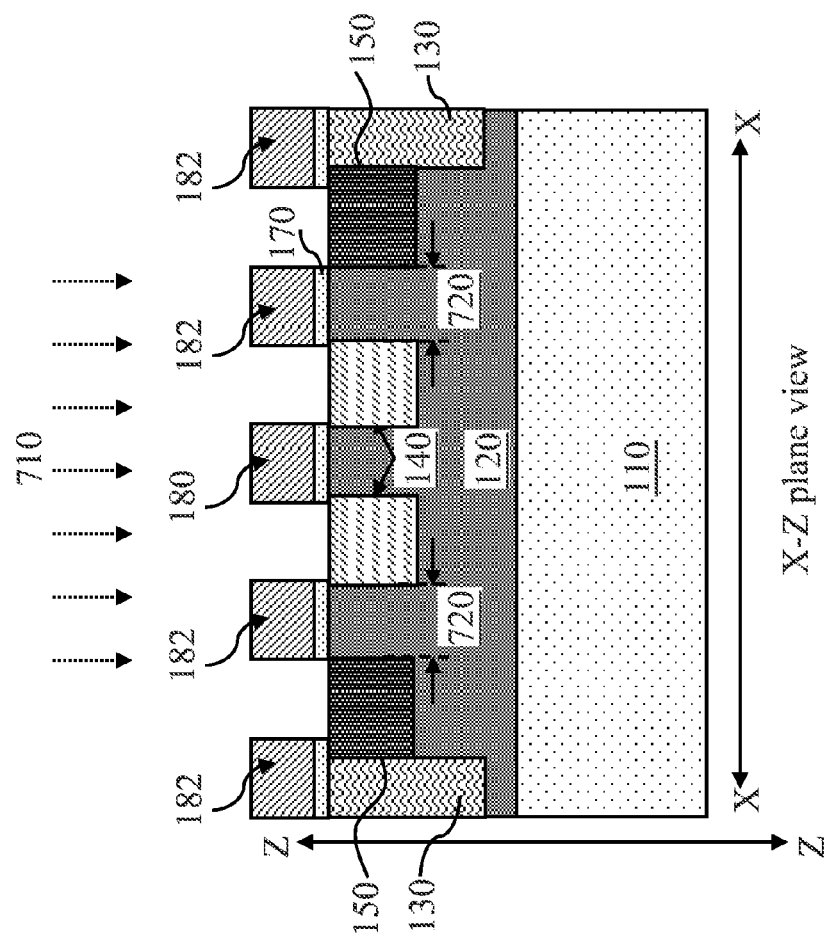

In FIG. 7, the formation of source/drain regions 140 and the body contacts 150 is illustrated. The source/drain regions 140 and the body contacts 150 may be doped by performing implanting process 710 to implant appropriate dopants to complement the dopants in the fin 120. In an embodiment, the fin 120 is implanted (as discussed above with reference to FIGS. 2A and 2B) with p-type dopants such as boron, gallium, indium, or the like, the source/drain regions are implanted with n-type dopants such as phosphorous, arsenic, antimony, or the like and the body contacts 150 are implanted with p-type dopants. The source/drain regions 140 are implanted using the gate 180 as a mask and the body contacts 150 are implanted using the dummy gates 182 as a mask. In some embodiments, the doped source/drain regions 140 and the doped body contacts 150 may be annealed to promote diffusion of the dopant impurities into the fin 120. In an embodiment, as shown in FIG. 7, the source/drain region 140 and the nearest body contact 150 may have a distance 720 between them of approximately 80 nm and 400 nm.

The body contacts 150 help to provide electrostatic discharge (ESD) protection for the source/drain regions 140. When the body contacts 150 are doped p-type and the source/drain regions 140 are doped n-type, a p-n junction is created in the fin 120 area between a source/drain region 140 and the nearest body contact 150. This p-n junction creates a parasitic body diode from the body contact 150 to the source/drain region 140 which will allow the body contact 150 to perform ESD protection with low on resistance. The body contacts 150 may be connected to an ESD discharging circuit such as a ground or power supply voltage. For example, in an illustrative embodiment, the fin 120 is doped p-type, the source/drain region 140 is doped n-type, the body contact 150 is doped p-type, and the distance 720 (see FIG. 7) between the source/drain region 140 and the body contact 150 is about 200 nm. As one of ordinary skill in the art will appreciate, the distance 720 may vary depending on the technology node of the device and the requirements of the circuit.

In another embodiment, the source/drain regions 140 and the body contacts 150 may be formed by forming recesses (not shown) in fin 120 and epitaxially growing material in the recesses. In an embodiment, the recesses may be formed by an anisotropic etch. Alternatively, the recesses may be formed by an isotropic orientation dependent etching process, wherein tetramethylammonium hydroxide (TMAH) or the like may be used as an etchant. After the recesses are formed, the source/drain regions 140 and the body contacts 150 may be formed by epitaxially growing material in the recesses. During the epitaxy process, etching gas, such as HCl gas, may be added (as an etching gas) into the process gas, so that the source/drain regions 140 and the body contacts 150 are selectively grown in the recesses, but not on the gates. In alternative embodiments, no etching gas is added, or the amount of etching gas is small, so that there is a thin layer of the source/drain regions 140 and the body contacts 150 formed on the substrate gates. In yet another embodiment, the gate 180 and dummy gates 182 could be covered with a sacrificial layer (not shown) to prevent epitaxial growth thereon. The source/drain regions 140 and the body contacts 150 may be doped either through an implantation method as discussed above, or else by in-situ doping as the material is grown.

The formation methods of the source/drain regions 140 and the body contacts 150 may include atomic layer deposition (ALD), chemical vapor deposition (CVD), such as a reduced pressure CVD (RPCVD), metalorganic chemical vapor deposition (MOCVD), or other applicable methods. Depending on the desirable composition of the source/drain regions 140 and the body contacts 150, the precursors for the epitaxial may include Si-containing gases and Ge-containing gases, such as SiH4 and GeH4, and/or the like, and the partial pressures of the Si-containing gases and Ge-containing gases are adjusted to modify the atomic ratio of germanium to silicon.

In another embodiment, the source/drain regions 140 are formed so as to impart a strain on the channel region underneath the gate 180. In an embodiment wherein the fin 120 comprises silicon, the source/drain regions 140 may then be formed through a SEG process with a material, such as silicon germanium, silicon carbon, or the like that has a different lattice constant than the silicon. The lattice mismatch between the stressor material source/drain regions 140 and the channel region formed underneath the gate 180 will impart a stress into the channel region that will increase the carrier mobility and the overall performance of the device. The source/drain regions 140 may be doped either through an implantation method as discussed above, or else by in-situ doping as the material is grown.

Figure 8:
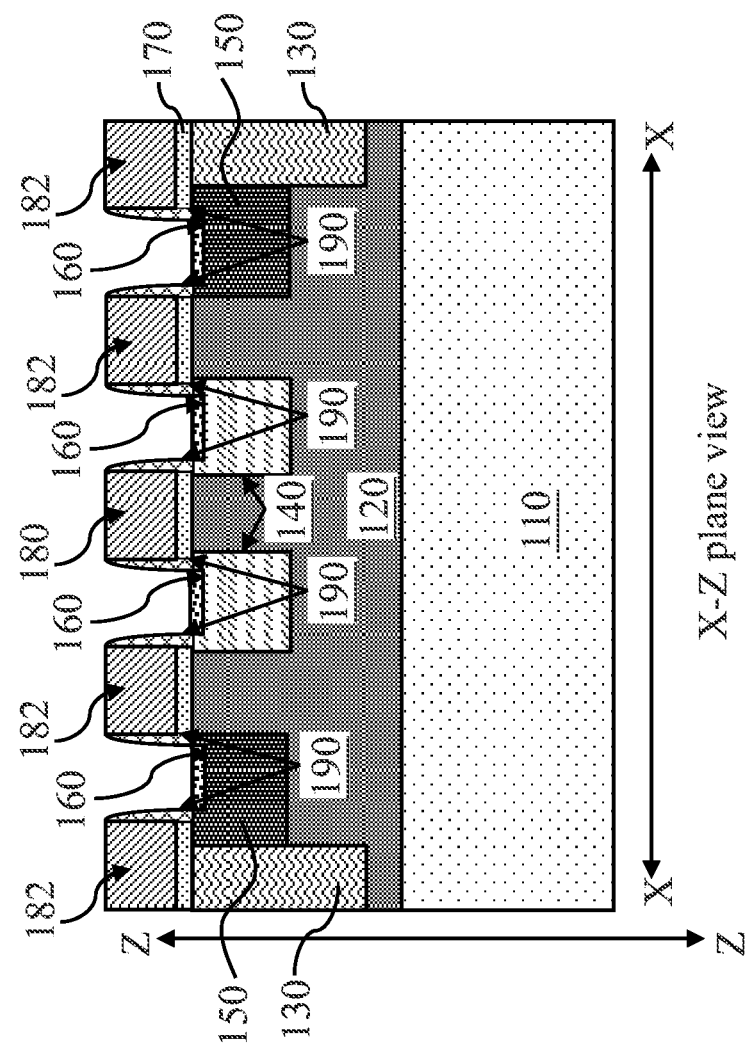

FIG. 8 illustrates the formation of gate spacers 190 on opposite sides of the gates and the formation of the electrode layer 160. The gate spacers 190 are typically formed by blanket depositing a spacer layer (not shown) on the previously formed structure. The spacer layer may comprise of SiN, oxynitride, SiC, SiON, oxide, and the like and may be formed by methods utilized to form such a layer, such as chemical vapor deposition (CVD), plasma enhanced CVD, sputter, and other methods known in the art. The gate spacers 190 are then patterned, preferably by anisotropically etching to remove the spacer layer from the horizontal surfaces of the structure.

The electrode layer 160 may comprise a conductive material and may be selected from a group comprising of polycrystalline-silicon (poly-Si), poly-crystalline silicon-germanium (poly-SiGe), metallic nitrides, metallic silicides, metallic oxides, and metals. The electrode layer 160 may be deposited by CVD, sputter deposition, or other techniques known and used in the art for depositing conductive materials.

In another embodiment, the source/drain regions 140 may comprise a lightly doped region and a heavily doped region. In this embodiment, before the gate spacers 190 are formed, the source/drain regions 140 may be lightly doped. After the gate spacers 190 are formed, the source/drain regions 140 may then be heavily doped. This forms lightly doped regions and heavily doped regions. The lightly doped regions are primarily underneath the gate spacers 190 while the heavily doped regions are outside of the gate spacers 190 along the fin 120.

Figure 9:
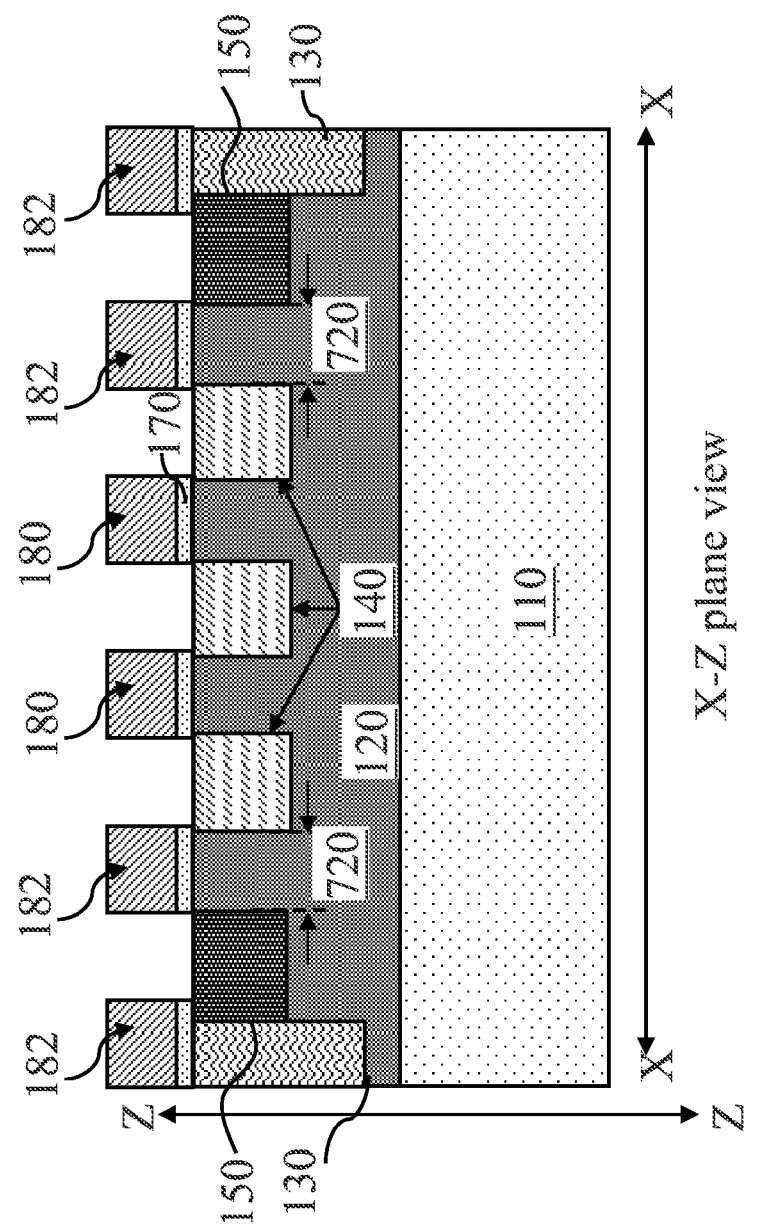
FIG. 9 illustrates in cross-sectional view, a second illustrative embodiment of a finFET device structure.

FIG. 9 illustrates a cross-sectional view of a second embodiment in which the finFET device comprises a double-gate configuration with three source/drain regions 140. In this embodiment, one source/drain region 140 laterally separates the two gates 180 and the two other source/drain regions are on the outer sides of the two gates 180. Similar to the embodiment in FIG. 7, the outer source/drain regions 140 are laterally separated by a distance 720 from the nearest body contact 150.

The embodiment in FIG. 9 may begin formation as shown in FIGS. 2A through 5B. After the gate electrode layer 510 is deposited (see FIGS. 5A and 5B), the gate electrode layer 510 is patterned to form the two gates 180 and the four dummy gates 182 (see FIG. 9). After the gates 180 and the dummy gates 182 are formed, the source/drain regions 140, the body contacts 150, the gate spacers 190, and the electrode layer 160 may be formed. The formation of the source/drain regions 140, the body contacts 150, the gate spacers 190, and the electrode layer 160 has been described above with respect to FIGS. 7 and 8, and hence is not repeated herein.

Figure 10A:
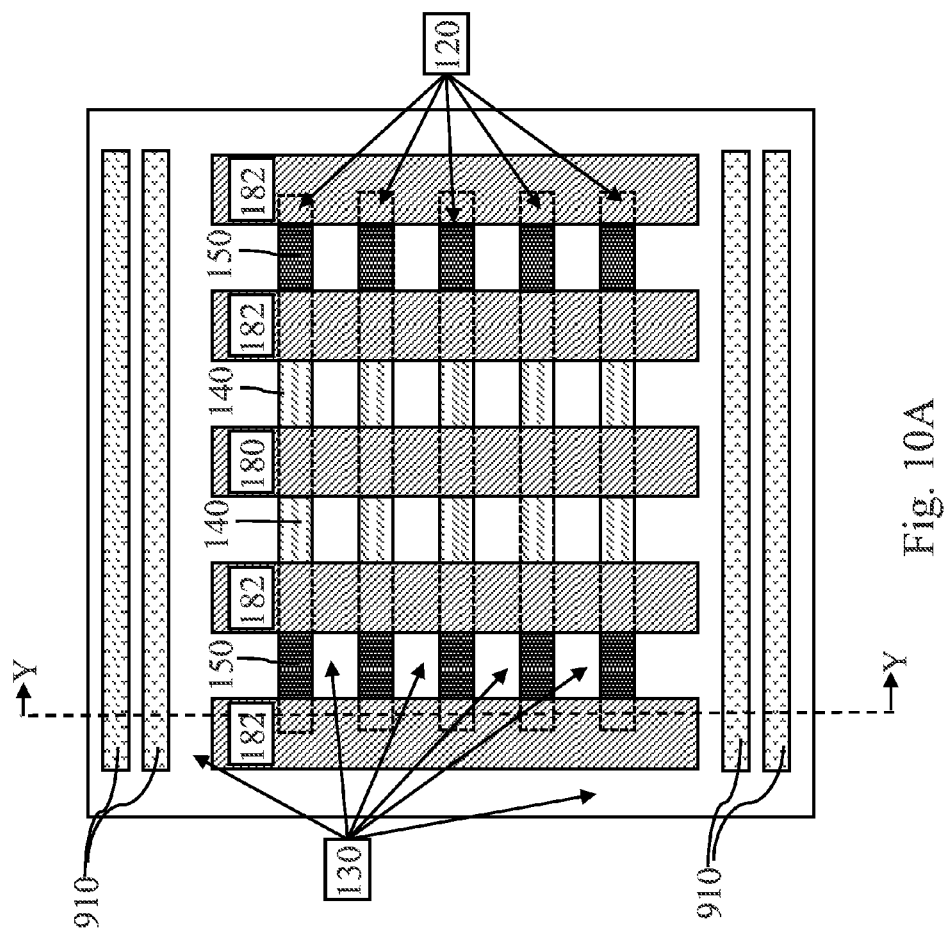
FIGS. 10A and 10B illustrate in top-down view and cross-sectional view, respectively, a second illustrative embodiment of a finFET device structure.
Figure 10B:
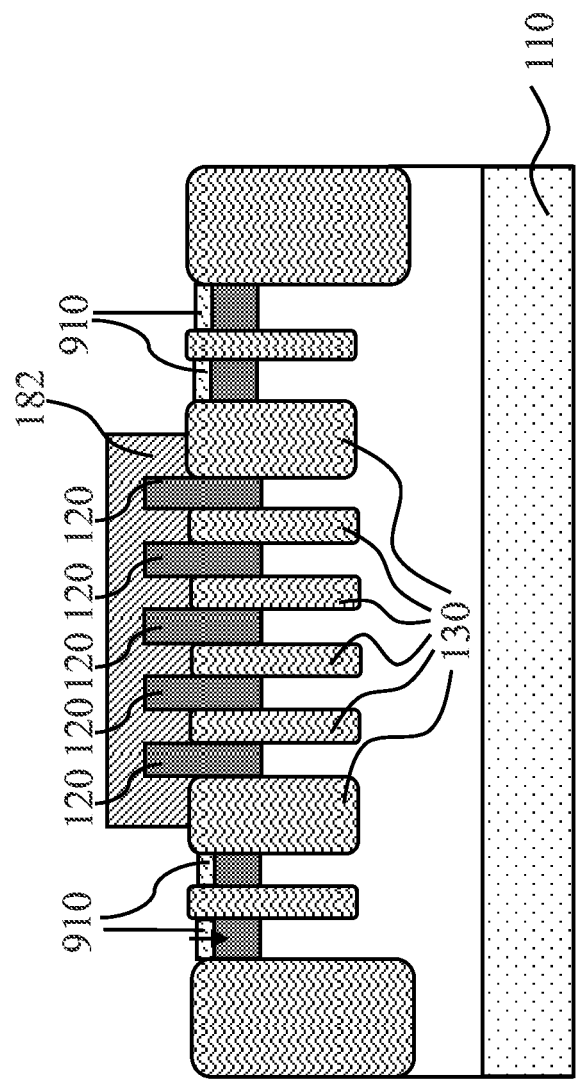

FIG. 10A illustrates a top-down view of an embodiment of the finFET device, wherein the device has substrate body contacts 910 above and below the fin structure. As shown in FIG. 10A, the substrate body contacts 910 are separated from the fins 120 and gates 180 and 182 by the isolation region 130. These substrate body contacts 910 help to provide ESD protection to the finFET device. FIG. 10A shows five fins 120 spaced apart from each other that are substantially parallel to each other. Each fin 120 has source/drain regions 140 and body contacts 150. Additionally, the source/drain regions 140 and the body contacts 150 of each fin 120 are on opposite sides of the dummy gate 182. The gate 180 and the dummy gates 182 are substantially parallel to each other and are perpendicular to the fins 120. FIG. 10B is a cross-sectional view along the line YY from FIG. 10A. FIG. 10B shows that the substrate body contacts 910 are separated from the fins 120 and the dummy gate 182 by the isolation region 130.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor structure, the method comprising:
   forming a semiconductor fin on a substrate;

forming a first gate structure on a top surface and sidewalls of the semiconductor fin;

forming a second gate structure on the top surface and sidewalls of the semiconductor fin, the second gate structure being laterally spaced from the first gate structure;

forming a third gate structure on the top surface and sidewalls of the semiconductor fin, the third gate structure being laterally spaced form the first gate structure in a direction opposite from the second gate structure;

forming a first source/drain region in the semiconductor fin, the first source/drain region being laterally between the first gate structure and the second gate structure;

forming a second source/drain region in the semiconductor fin, the second source/drain region being laterally between the first gate structure and the third gate structure;

forming a first body contact in the semiconductor fin, the first body contact being laterally spaced from first source/drain region, the second gate structure being laterally between the first source/drain region and the first body contact; and forming a second body contact in the semiconductor fin, the second body contact being laterally spaced from second source/drain region, the third gate structure being laterally between the second source/drain region and the second body contact.

2. The method of claim 1, wherein the forming the first source/drain region comprises:
patterning the semiconductor fin to form a first recess; and
epitaxially growing the first source/drain region in the first recess.

3. The method of claim 1 further comprising:
forming a third source/drain region in the semiconductor fin, the third source/drain region being laterally spaced from the second source/drain region in a direction opposite the first source/drain region.

4. The method of claim 1 further comprising:
forming a fourth gate structure on the top surface and sidewalls of the semiconductor fin, wherein the fourth gate structure partially overlaps the first body contact.

5. The method of claim 1 further comprising:
forming a fourth gate structure on the top surface and sidewalls of the semiconductor fin; and
forming an isolation region in the semiconductor fin adjoining the first body contact, the fourth gate structure partially overlapping the isolation region and partially overlapping the first body contact.

6. The method of claim 1, wherein the first gate structure is an active gate, and the second gate structure and the third gate structure are dummy gates.

7. The method of claim 1 further comprising:
implanting the semiconductor fin with dopants of a first conductivity type;
implanting the first source/drain region with dopants of a second conductivity type; and
implanting the first body contact with dopants of the first conductivity type.

8. The method of claim 1, wherein a first portion of the semiconductor fin extends from the first body contact to the first source/drain region, the first portion being a semiconductor material.

9. A method comprising:
forming a fin extending from a substrate;
forming a first gate and a second gate over the fin;
forming a first source/drain region in the fin between the first and second gates; and
forming a first body contact in the fin, the second gate partially overlapping the first body contact.

10. The method of claim 9 further comprising:
forming a third gate over the fin between the first source/drain region and the first body contact.

11. The method of claim 10, wherein the third gate is directly over a first portion of the fin, the first portion being a semiconductor material.

12. The method of claim 9 further comprising:
doping the fin with dopants of a first conductivity type;
wherein the forming the first source/drain region in the fin comprises doping the first source/drain region with dopants of a second conductivity type; and
wherein the forming the first body contact in the fin comprises doping the first body contact with dopants of the first conductivity type.

13. The method of claim 12, wherein the first conductivity type is p-type and the second conductivity type is n-type.

14. The method of claim 9 further comprising:
forming a first isolation region in the fin, the second gate partially overlapping the first isolation region.

15. The method of claim 9 further comprising:
forming a fourth gate over the fin;
forming a second source/drain region laterally between the first gate and the fourth gate; and
forming a second body contact in the fin, the fourth gate partially overlapping the second body contact.

16. The method of claim 15, wherein the first gate is an active gate, and wherein the second and fourth gates are dummy gates.

17. A method comprising:
forming a semiconductor fin raised above a substrate;
forming a first active gate over the semiconductor fin;
forming a first dummy gate over the semiconductor fin;
forming a first source/drain region in the semiconductor fin between the first active gate and the first dummy gate, the first source/drain region being adjacent a first side of the first dummy gate;
forming a first body contact in the semiconductor fin adjacent a second side of the first dummy gate, the second side being opposite the first side, the first dummy gate being aligned with the first body contact; and
forming a spacer overlapping the first body contact.

18. The method of claim 17, wherein the first dummy gate is over a first portion of the semiconductor fin, the first portion extending from the first body contact to the first source/drain region, the first portion being a semiconductor material.

19. The method of claim 17 further comprising:
forming a second dummy gate over the fin;
forming a second source/drain region in the semiconductor fin between the first active gate the second dummy gate; and
forming a second body contact in the semiconductor fin adjacent the second dummy gate.

20. The method of claim 1, wherein the second gate structure is aligned with the first body contact.

* * * * *